United States Patent
Chung

(10) Patent No.: US 9,030,398 B2
(45) Date of Patent: May 12, 2015

(54) SHIFT REGISTER CIRCUIT, SOURCE DRIVER INCLUDING THE SAME, AND METHOD

(75) Inventor: Kyuyoung Chung, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 695 days.

(21) Appl. No.: 12/946,388

(22) Filed: Nov. 15, 2010

(65) Prior Publication Data

US 2011/0199353 A1    Aug. 18, 2011

(30) Foreign Application Priority Data

Feb. 12, 2010   (KR) .................. 10-2010-0013584

(51) Int. Cl.
- *G09G 3/36* (2006.01)
- *G11C 19/00* (2006.01)
- *G11C 19/28* (2006.01)

(52) U.S. Cl.
CPC .............. *G11C 19/00* (2013.01); *G09G 3/3688* (2013.01); *G09G 2310/027* (2013.01); *G09G 2310/0286* (2013.01); *G09G 2330/021* (2013.01); *G11C 19/28* (2013.01)

(58) Field of Classification Search
CPC ...................................... G09G 3/3685–3/3688
USPC ....................................................... 345/100
See application file for complete search history.

(56) References Cited

U.S. PATENT DOCUMENTS

| | | | |
|---|---|---|---|
| 6,249,270 B1 * | 6/2001 | Ito | 345/100 |
| 6,727,876 B2 | 4/2004 | Kang | |
| 7,106,292 B2 | 9/2006 | Moon | |
| 7,663,580 B2 * | 2/2010 | Shin | 345/82 |
| 8,040,313 B2 * | 10/2011 | Jang | 345/100 |
| 8,344,989 B2 * | 1/2013 | Kim | 345/100 |
| 2002/0089476 A1 * | 7/2002 | Kang | 345/87 |
| 2005/0285840 A1 * | 12/2005 | Jang et al. | 345/100 |
| 2006/0181502 A1 * | 8/2006 | Kubota et al. | 345/100 |
| 2006/0227094 A1 * | 10/2006 | Park et al. | 345/100 |
| 2006/0267911 A1 | 11/2006 | Jang | |
| 2008/0191993 A1 * | 8/2008 | Chiang et al. | 345/100 |

FOREIGN PATENT DOCUMENTS

| | | |
|---|---|---|
| JP | 09-153296 A | 6/1997 |
| KR | 10-2002-0057768 A | 7/2002 |

OTHER PUBLICATIONS

Korean Office Action issued on Jul. 20, 2011, in counterpart Korean Patent Application No. 10-2010-0013584 (7 pages).
Chinese Office Action issued Oct. 17, 2014 in counterpart Application No. CN 201010623034.8 (18 pages, in Chinese, with English language translation).

* cited by examiner

*Primary Examiner* — Roy Rabindranath
(74) *Attorney, Agent, or Firm* — NSIP Law

(57) ABSTRACT

A shift register circuit and method includes: a plurality of shift registers configured to generate latch clock signals by sequentially shifting input signals according to first and second clock signals, the first and second clock signals including: periods longer than a shift register clock signal, and phases different from each other, wherein odd shift registers among the plurality of shift registers are configured to be driven by the first clock signal, and wherein even shift registers are configured to be driven by the second clock signal.

28 Claims, 9 Drawing Sheets

SHIFT REGISTER CIRCUIT, SOURCE DRIVER INCLUDING THE SAME, AND METHOD

CROSS-REFERENCE TO RELATED APPLICATION(S)

This application claims the benefit under 35 U.S.C. §119 (a) of Korean Patent Application No. 10-2010-0013584, filed on Feb. 12, 2010, in the Korean Intellectual Property Office, the entire disclosure of which is incorporated herein by reference for all purposes.

BACKGROUND

1. Field

The following description relates to a source driver for use in a flat panel display (FPD) device, and more particularly, to a shift register circuit with improved operation characteristic, and a source driver for use in an FPD device, which includes the shift register circuit.

2. Description of Related Art

In general, an FPD device such as a TFT-LCD includes a flat panel display panel, a gate driver configured to drive gate lines of the flat panel display panel, and a source driver configured to drive source lines of the flat panel display panel.

As illustrated in FIG. 1, a conventional source driver includes a shift register circuit 100, a data register circuit 200, a hold register circuit 300, a level shifter circuit 400, a decoder circuit 500, and an output buffer circuit 600. The shift register circuit 100 is configured to generate latch clocks F_LAT1 to F_LATn to the data register circuit 200 according to a shift register clock signal SFT_CK so that RGB data to be displayed are sequentially stored therein.

The conventional shift register circuit 100 includes a plurality of shift registers S/R1 to S/Rn connected in series. Referring to FIG. 2, the shift registers S/R1 to S/Rn are configured to generate output signals SFT_OUT1 to SFT_OUTn by shifting a horizontal start signal STV at rising edges of the shift register clock SFT_CK during one horizontal sync clock HSYNC. Logic gates GA1 to GAn are configured to logically combine the output signals SFT_OUT1 to SFT_OUTn of the shift registers S/R1 to S/Rn and the shift register clock signal SFT_CK and provide the resulting signals to first latches of the data register circuit 200 as the latch clock signals F_LAT1 to F_LATn, and the first latches are configured to latch display data RGB. The hold register circuit 300 includes second latches configured to hold the display data RGB stored in the data register circuit 200 in response to a load signal SLAT.

In the conventional shift register circuit 100, since the shift registers S/R1 to S/Rn are implemented with only D flip-flops, the circuit size is small and the circuit configuration is simple. However, when the period of the shift register clock signal SFT_CK is short, a holding margin for the horizontal start signal STV is insufficient. In this case, since the shifting operation is not well performed, the shift registers S/R1 to S/Rn cannot normally generate the output signals SFT_OUT1 to SFT_OUTn. Consequently, the latch clock signals F_LAT1 to F_LATn cannot also be generated.

To solve these problems, a shift register circuit 100 of FIG. 3 was suggested. FIG. 3 illustrates only the shift registers S/R1 to S/Rn of the shift register circuit 100 of FIG. 1.

Referring to FIG. 3, the conventional shift register circuit 100 includes a plurality of shift registers S/R1 to S/Rn arranged in series. Each of the shift registers S/R1 to S/Rn is implemented with two flip-flops DF1 and DF2 connected in series. Referring to a waveform diagram of FIG. 4, the flip-flops DF1 provided at the front stage are configured to generate pulse signals SFT_P1 to SFT_Pn by shifting the horizontal start signal STV being input signals, or the output signals SFT_OUT1 to SFT_OUTn−1 of the previous shift registers S/R1 and S/Rn−1 at rising edges of the shift register clock signal SFT_CK. Meanwhile, the flip-flops DF2 provided at the rear stage are configured to generate the output signals SFT_OUT1 to SFT_OUTn−1 of the shift registers S/R1 to S/Rn−1 by shifting the pulse signals SFT_P1 to SFT_Pn−1 at falling edges of the shift register clock signal SFT_CK. A reset signal SFT_RSTB resets the flip-flops DF1 and DF2.

When assuming that the period of the shift register clock signal SFT_CK is Tck, the conventional shift register circuit 100 can ensure the holding margin more than Tck/2 with respect to the horizontal start signal STV, as compared with the case in which each shift register is implemented with a single flip-flop. Consequently, the shift register circuit 100 can operate more stably. However, since each shift register is implemented with two flip-flops, the circuit size increases.

In addition, referring to FIG. 5, when a signal STV_R generated by delaying the horizontal start signal STV by a delay time "td,stv" is applied to the input terminal D of the front flip-flop DF1 of the foremost shift register S/R1, and a signal SFT_CK_R generated by delaying the shift register clock signal SFT_CK by a delay time "td,ck" is applied to as the clock signal CK of the flip-flop DF1, the conventional shift register circuit 100 cannot perform the shifting operation if (td,ck)>(td,stv+Tck/2). That is, when Tck is small, the holding margin with respect to the horizontal start signal STV is still insufficient and thus the shift registers cannot normally generate the output signals.

Furthermore, since the shift register clock signal SFT_CK is continuously provided as the clock signal CK of the flip-flops DF1 and DF2 included in the shift registers having completed the shifting operation, the shift registers performing no shifting operation continuously latch the same data, causing unnecessary current consumption. In particular, since the shift register circuit 100 of the source driver shifts only one high level pulse, it serves as a fatal cause of unnecessary current consumption. Since only one of the shift registers constituting the shift register circuit 100 performs the shifting operation, current consumption is relatively large.

SUMMARY

An embodiment is directed to a shift register circuit with improved operation characteristic, and a source driver for use in an FPD device, which includes the shift register circuit.

In one general aspect, there is provided a shift register circuit, including: a plurality of shift registers configured to generate latch clock signals by sequentially shifting input signals according to first and second clock signals, the first and second clock signals including: periods longer than a shift register clock signal, and phases different from each other, wherein odd shift registers among the plurality of shift registers are configured to be driven by the first clock signal, and wherein even shift registers are configured to be driven by the second clock signal.

In the shift register circuit, the phase of the second clock signal may lag behind the phase of the first clock signal.

In the shift register circuit, the first and second clock signals may include two times the period of the shift register clock signal.

In the shift register circuit, the phase of the second clock signal may lag behind the phase of the first clock signal by the period of the shift register clock signal.

In the shift register circuit: the odd shift registers may be configured to perform the shifting operation at rising edges of the first clock signal in response to a horizontal start signal or an output signal of a previous shift register, provided as an input signal, being at a high level, and the even shift registers may be configured to perform the shifting operation at rising edges of the second clock signal in response to an output signal of a previous shift register being at a high level.

In the shift register circuit, in response to the plurality of shift registers completing the shifting operation, a level of an output signal of a previous shift register may be configured to change after an output signal of a next shift register is generated.

In the shift register circuit, the plurality of shift registers may be configured to be controlled by an output signal of a next shift register, such that only one shift register performs a shifting operation.

In the shift register circuit, each of the shift registers may include: a clock controller configured to control the first and second clock signals, a shift register configured to shift the input signal in response to a gate signal provided from the clock controller, and an output controller configured to control the output signal of the shift register.

In the shift register circuit, the clock controller may include an AND gate configured to: receive the horizontal start signal or the output signal of the previous shift register as one input signal, receive the first clock signal or the second clock signal as another input signal, and generate the gate signal.

In the shift register circuit, the shift register may include a dynamic latch configured to be: supplied with a power supply voltage through an input terminal, and supplied with the output signal of the clock controller as the gate signal.

In the shift register circuit, the output controller may include a NOR gate configured to: receive the output signal of the previous shift register and a shift register reset signal, and generate a reset signal of the dynamic latch.

In another general aspect, there is provided a source driver for use in a flat panel display device, including: a data register circuit configured to latch external data to be displayed on the flat panel display device, according to latch clock signals, and a shift register circuit configured to: shift input signals, according to first and second clock signals including different phases, and provide the latch clock signals to the data register circuit.

In the source driver, the first and second clock signals may include two times the period of a shift register clock signal.

In the source driver, the phase of the second clock signal may lag behind the phase of the first clock signal by the period of the shift register clock signal.

In the source driver: the shift register circuit may include a plurality of shift registers configured to generate the latch clock signals by sequentially shifting the input signals, according to the first and second clock signals, the first clock signal may be provided to the odd shift registers among the plurality of shift registers, and the second clock signal including the phase lagging behind the phase of the first clock signal by the period of the shift register clock signal may be provided to the even shift registers among the plurality of shift registers.

In the source driver, in response to the plurality of shift registers completing the shifting operation, a level of an output signal of a previous shift register may be configured to change after an output signal of a next shift register is generated.

In the source driver, the shift register may be configured to be controlled by an output signal of a next shift register, such that the shift register shifts the input signal in response to the first or second clock signal during only a high level duration of the input signal.

In the source driver, each of the shift registers may include: a clock controller configured to control the first and second clock signals, a shift register configured to: receive an output signal of the clock controller as a gate signal, and shift the input signal, and an output controller configured to control an output signal of the shift register.

In the source driver, the clock controller may include an AND gate configured to: receive a horizontal start signal or the output signal of the previous shift register as one input signal, receive the first clock signal or the second clock signal as another input signal, and generate the gate signal.

In the source driver, the shift register may include a dynamic latch configured to be: supplied with a power supply voltage through an input terminal, and supplied with the output signal of the AND gate as the gate signal.

In the source driver, the output controller may include a NOR gate configured to: receive the output signal of the previous shift register and a shift register reset signal, and generate a reset signal of the dynamic latch.

The source driver may further include a latch clock generator configured to: receive the output signal of the dynamic latch and the first or second clock signal, and generate the latch clock signal.

In another general aspect, there is provided a method for a shift register circuit, including: generating latch clock signals with a plurality of shift registers by sequentially shifting input signals according to first and second clock signals, the first and second clock signals including: periods longer than a shift register clock signal, and phases different from each other, wherein odd shift registers among the plurality of shift registers are driven by the first clock signal, and wherein even shift registers are driven by the second clock signal.

In the method, the phase of the second clock signal may lag behind the phase of the first clock signal.

In the method, the first and second clock signals may include two times the period of the shift register clock signal.

In the method, the phase of the second clock signal may lag behind the phase of the first clock signal by the period of the shift register clock signal.

In the method: the odd shift registers may perform the shifting operation at rising edges of the first clock signal in response to a horizontal start signal or an output signal of a previous shift register, provided as an input signal, being at a high level, and the even shift registers may perform the shifting operation at rising edges of the second clock signal in response to an output signal of a previous shift register being at a high level.

Other features and aspects may be apparent from the following detailed description, the drawings, and the claims.

Figure 1:
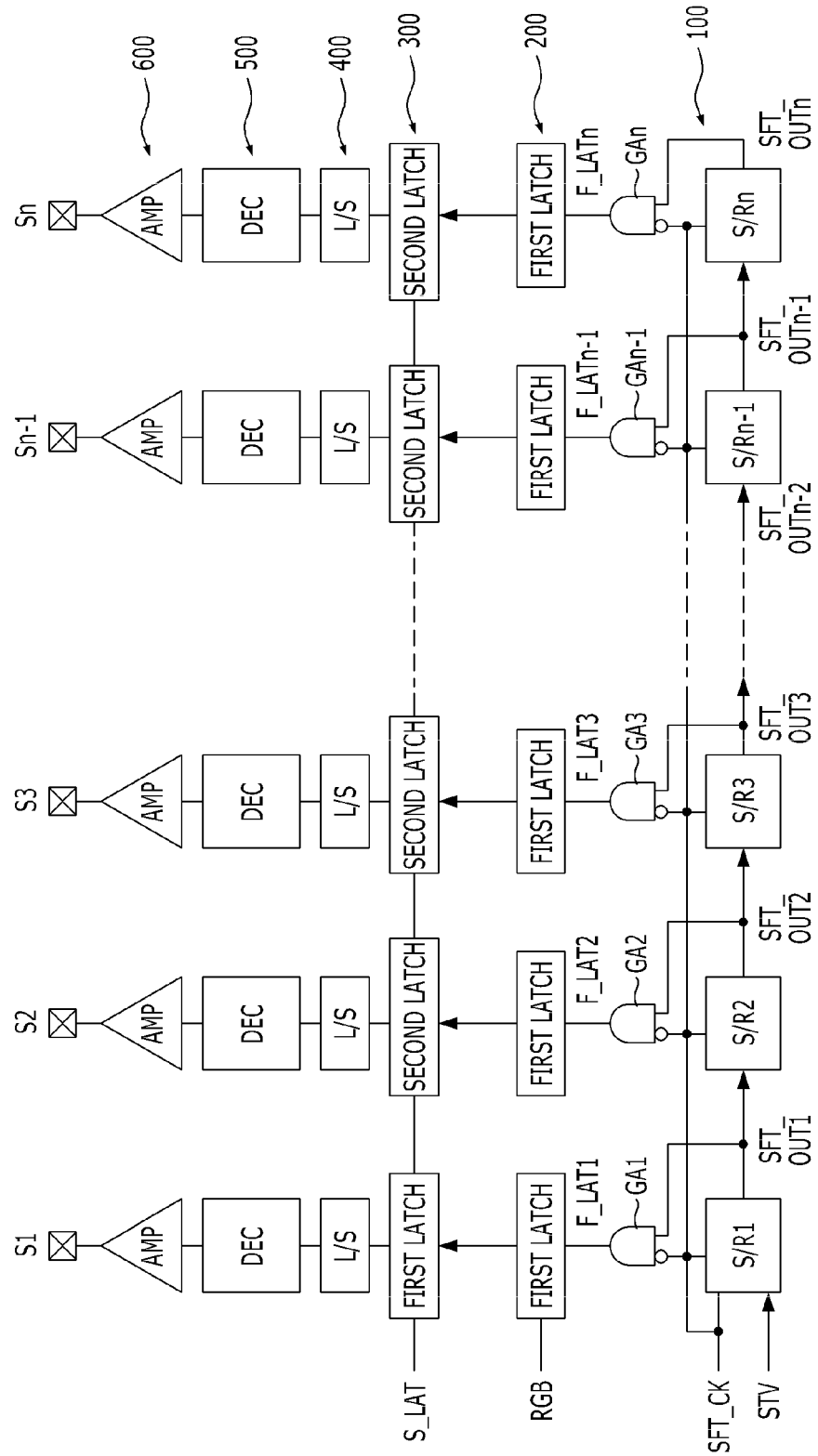
FIG. 1 is a configuration diagram of a conventional source driver.
Figure 2:
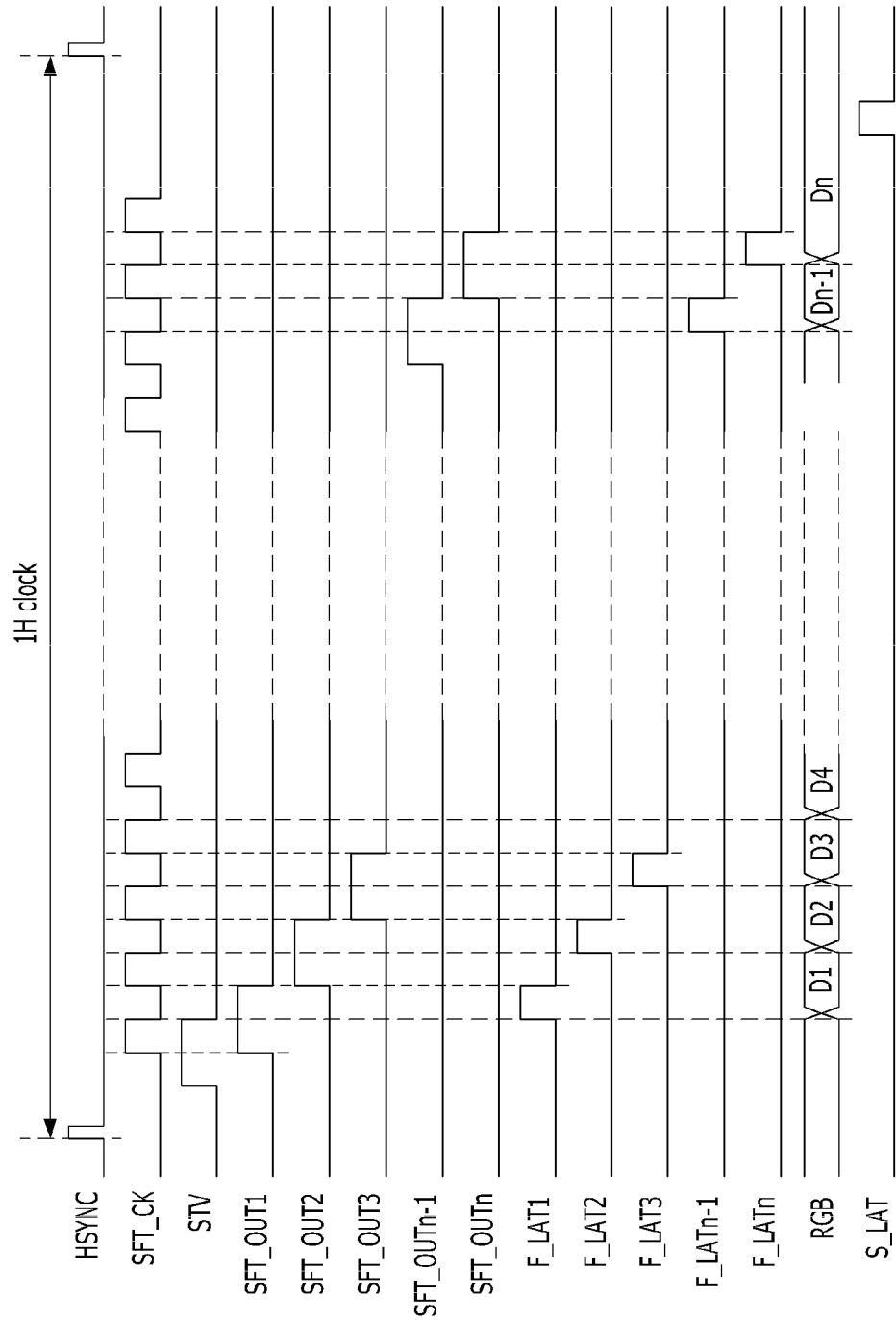
FIG. 2 is a waveform diagram illustrating the operation of the source driver of FIG. 1.
Figure 3:
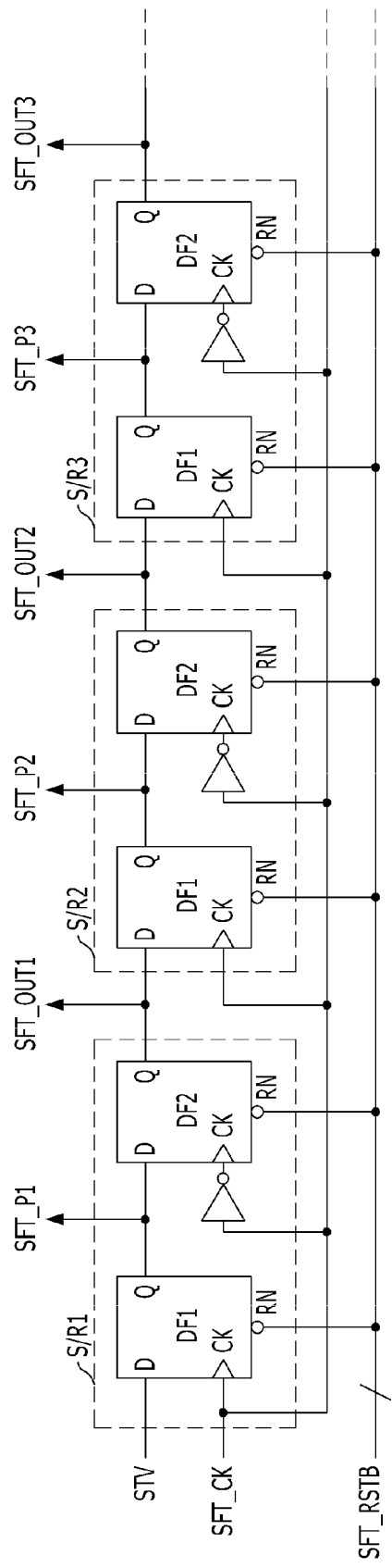
FIG. 3 is a configuration diagram illustrating a shift register circuit of the source driver of FIG. 1.
Figure 4:
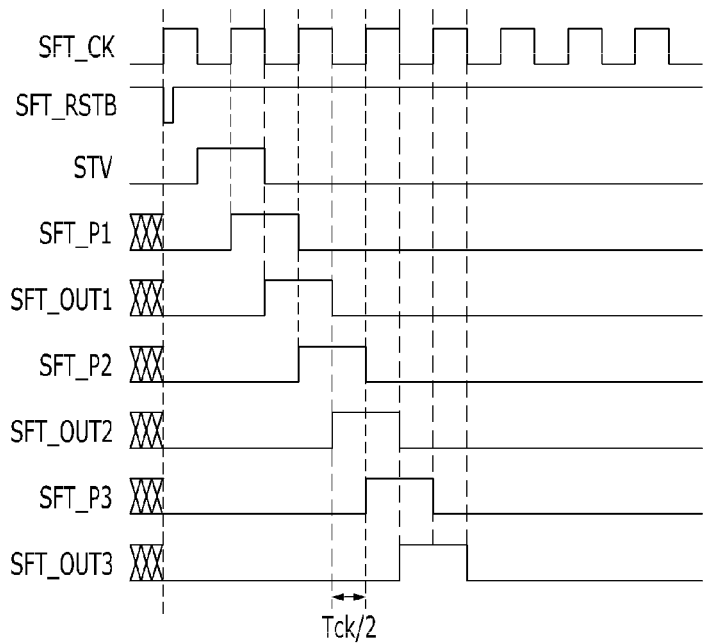
FIG. 4 is a waveform diagram illustrating the operation of the shift register circuit of FIG. 3.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

Figure 6:
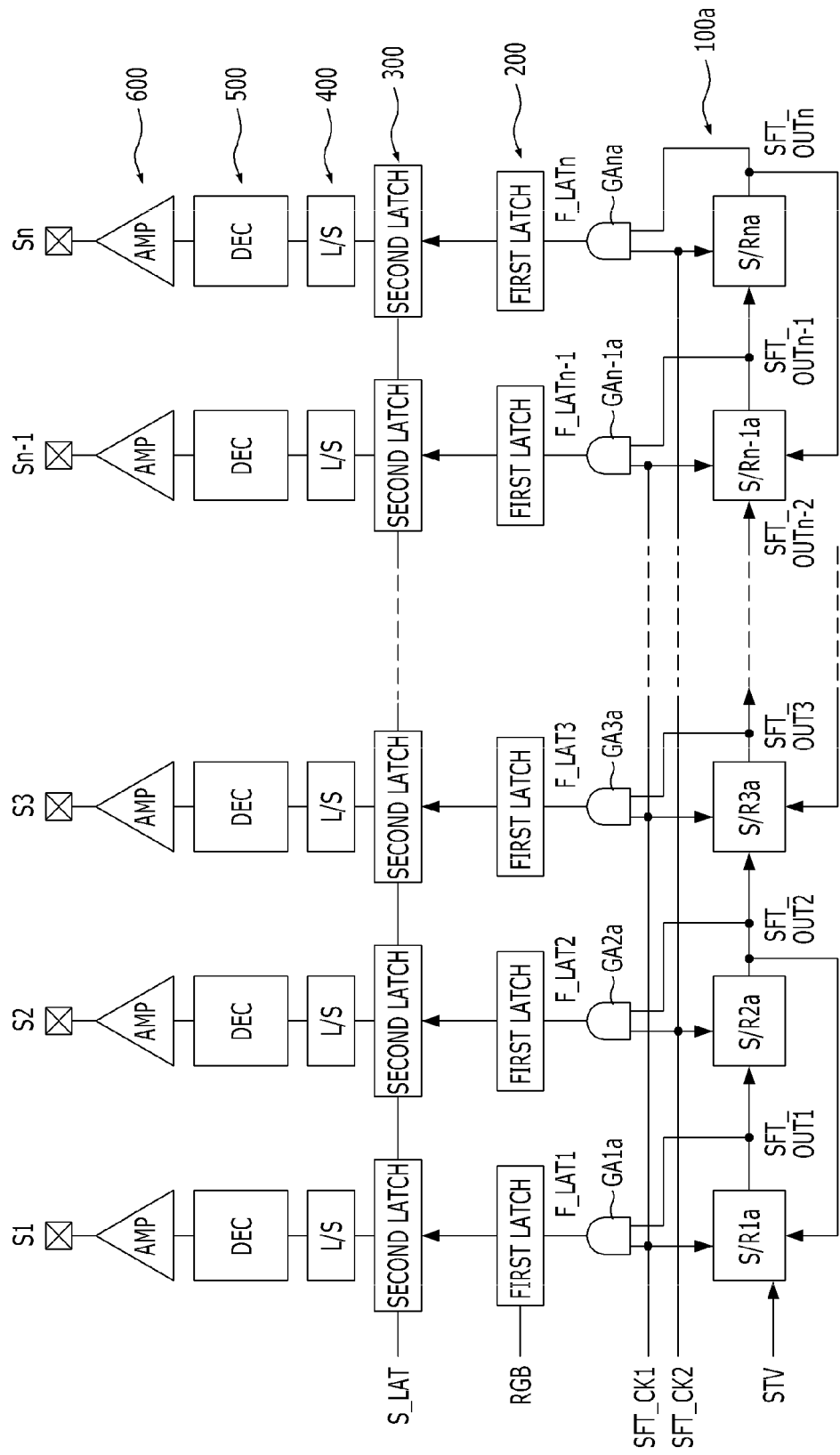
FIG. 6 is a configuration diagram of a source driver in accordance with an embodiment.
Figure 7:
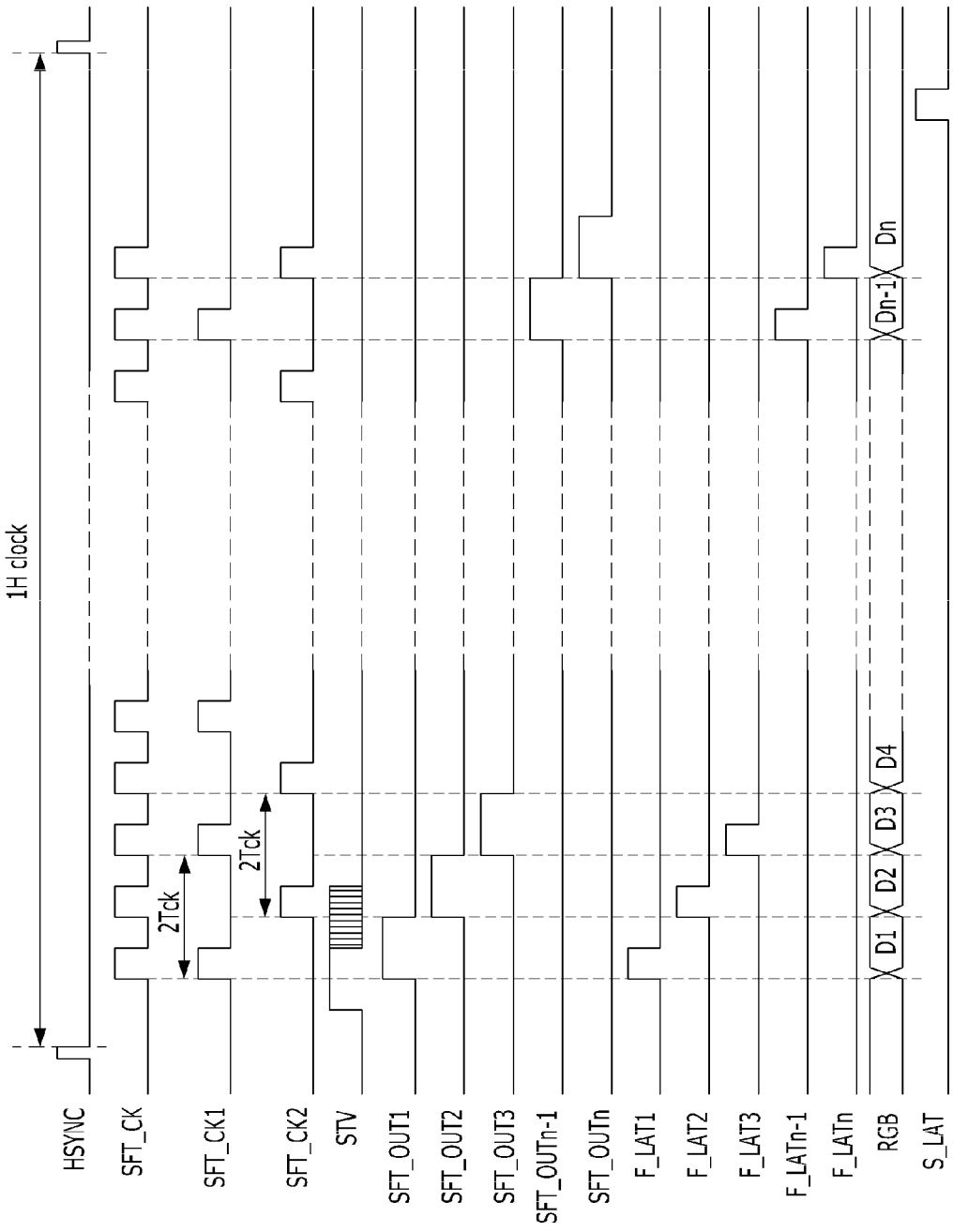
FIG. 7 is a waveform diagram illustrating the operation of the source driver of FIG. 6.

FIG. 6 is a configuration diagram of a source driver for an FPD device in accordance with an embodiment. FIG. 7 is a waveform diagram illustrating the operation of the source driver of FIG. 6.

Referring to FIG. 6, the source driver may include a shift register circuit 100a, a data register circuit 200, a hold register circuit 300, a level shifter circuit 400, a decoder circuit 500, and an output buffer circuit 600.

Referring to FIGS. 6 and 7, the shift register circuit 100a may be configured to generate latch clock signals F_LAT1 to F_LATn to first latches of the data register circuit 200, according to first and second clock signals SFT_CK1 and SFT_CK2 having different phases. The first latches of the data register circuit 200 may be configured to sequentially store external predetermined-bit display data RGB according to the latch clock signals F_LAT1 to F_LATn.

The hold register circuit 300 may include second latches configured to hold the display data RGB stored in the data register circuit 200 in response to a load signal S_LAT, and the level shifter circuit 400 may include level shifters L/S configured to convert the data stored in the hold register circuit 300 into levels suitable for the display panel. The level-shifted data may be decoded by decoders DEC of the decoder circuit 500 and provided to the display panel through buffers AMP of the output buffer circuit 600.

The shift register circuit 100a may include a plurality of shift registers S/R1a to S/Rna and a plurality of latch clock generators GA1a to GAna. The shift registers S/R1a to S/Rna may be configured to generate output signals SFT_OUT1 to SFT_OUTn, according to the first and second clock signals SFT_CK1 and SFT_CK2 having different phases. The latch clock generators GA1a to GAna may be configured to logically combine the output signals SFT_OUT1 to SFT_OUTn and the first and second clock signals SFT_CK1 and SFT_CK2, and generate the latch clock signals F_LAT1 to F_LATn. Each of the latch clock generators GA1a to GAna may include an AND gate. The first clock signal SFT_CK1 may be provided as input signals of the odd AND gates among the AND gates of the latch clock generators GA1a to GA1n, and the second clock signal SFT_CK2 may be provided as input signals of the even AND gates among the AND gates of the latch clock generators GA1a to GA1n. The value n may be an even number.

The first and second clock signals SFT_CK1 and SFT_CK2 may be clock signals having two times the period of the shift register clock signal SFT_CK. That is, in response to the period of the shift register clock signal SFT_CK being Tck, the period of the first and second clock signals SFT_CK1 and SFT_CK2 may be 2Tck. The phase of the first clock signal SFT_CK1 may lead the phase of the second clock signal SFT_CK2 by Tck. The first clock signal SFT_CK1 may be a clock signal which rises at odd rising edges of the shift register clock signal SFT_CK, and the second clock signal SFT_CK2 may be a clock signal which rises at even rising edges of the shift register clock signal SFT_CK.

The operation of the source driver will now be described with reference to FIG. 7. The shift register circuit 100a may generate the odd output signals SFT_OUT1, SFT_OUT3, ..., SFT_OUTn-1 by shifting the horizontal start signal STV at the rising edges of the first clock signal SFT_CK1 through the odd shift registers S/R1a, S/R3a, ..., S/Rn-1a, and may generate the even output signals SFT_OUT2, SFT_OUT4, ..., SFT_OUTn by shifting the horizontal start signal STV at the rising edges of the second clock signal SFT_CK2 through the even shift registers S/R2a, S/R4a, ..., S/Rna.

The odd AND gates GA1a, GA3a, ..., GAn-1a may receive the odd output signals SFT_OUT1, SFT_OUT3, ..., SFT_OUTn-1 and the first clock signal SFT_CK1, and may generate the odd latch clock signals F_LAT1, F_LAT3, ..., F_LATn-1. The even AND gates GA2a, GA4a, ..., GAna may receive the even output signals SFT_OUT2, SFT_OUT4, ..., SFT_OUTn and the second clock signal SFT_CK2, and may generate the even latch clock signals F_LAT2, F_LAT4, ..., F_LATn.

The data register circuit 200 may sequentially latch the display data RGB in the first latches in response to the latch clock signals F_LAT1 to F_LATn outputted from the shift register circuit 100a. The hold register circuit 300 may store the output data of the data register circuit 200 in the second latches in response to the load signal S_LAT. As described above, the data stored in the hold register circuit 300 may be provided to a display panel through the level shifter circuit 400, the decoder circuit 500, and the output buffer circuit 600.

Figure 8:
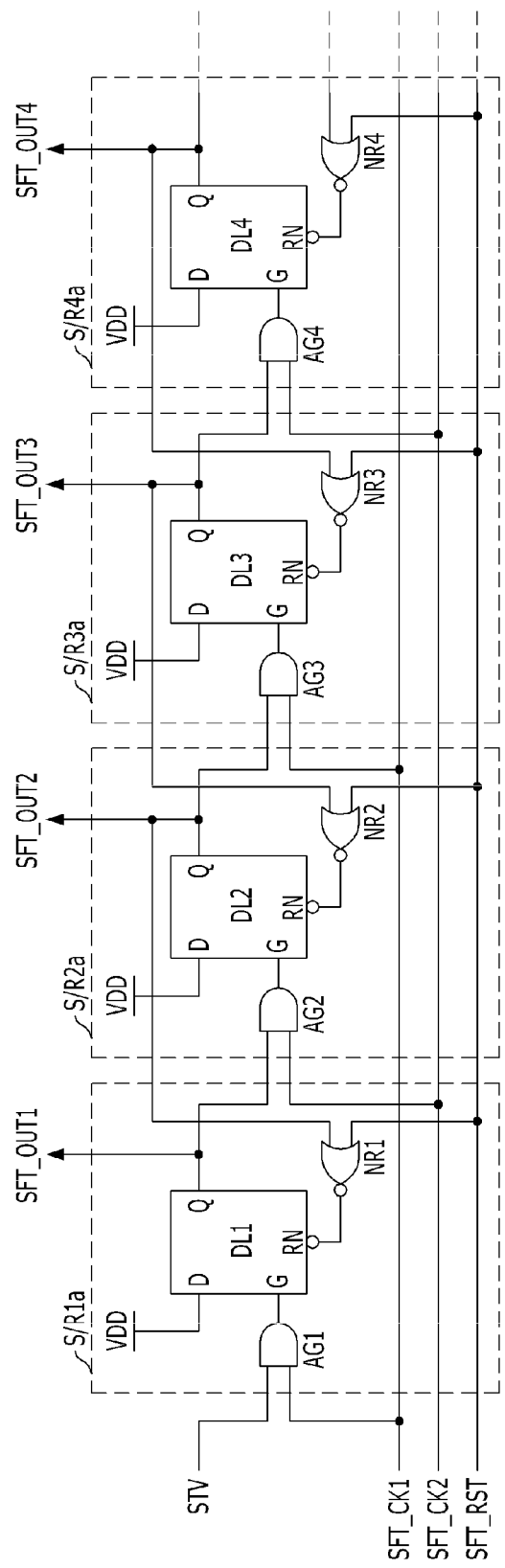
FIG. 8 is a configuration diagram illustrating a shift register circuit of the source driver of FIG. 6.

FIG. 8 is a detailed circuit diagram illustrating the shift register circuit 100a of the source driver of FIG. 6 in accordance with an embodiment. Only the shift registers S/R1a to S/Rna of FIG. 6 are illustrated in FIG. 8 for conciseness.

Referring to FIG. 8, the shift registers S/R1a to S/Rna may include latches DL1, DL2, ..., and clock controllers AG1, AG2, ..., respectively. The latches DL1, DL2, ... may be configured to shift the horizontal start signal STV. The clock controllers AG1, AG2, ... may be configured to control gate signals G of the latches DL1, DL2, ..., according to the horizontal start signal STV or one of the output signals SFT_OUT1, SFT_OUT2, ... of the latches DL1, DL2, ... and one of the first and second clock signals SFT_CK1 and SFT_CK2.

In addition, the shift registers S/R1a to S/Rna may include output controllers NR1, NR2, ... configured to receive the output signals SFT_OUT2, SFT_OUT3, ... of the next latches DL2, DL3, . . . and a shift register reset signal SFT_RST, and may maintain the output signals of the previous latches DL1, DL2, . . . until the output signals of the next latches DL2, DL3, . . . are generated. The latches DL1, DL2, . . . may include dynamic latches which have input terminals supplied with a high-level power supply voltage VDD and gate terminals supplied with the output signals of the clock controllers AG1 to AGn, respectively. The clock controllers AG1, AG2, . . . may include AND gates, and the output controllers NR1, NR2, . . . may include NOR gates.

Figure 9:
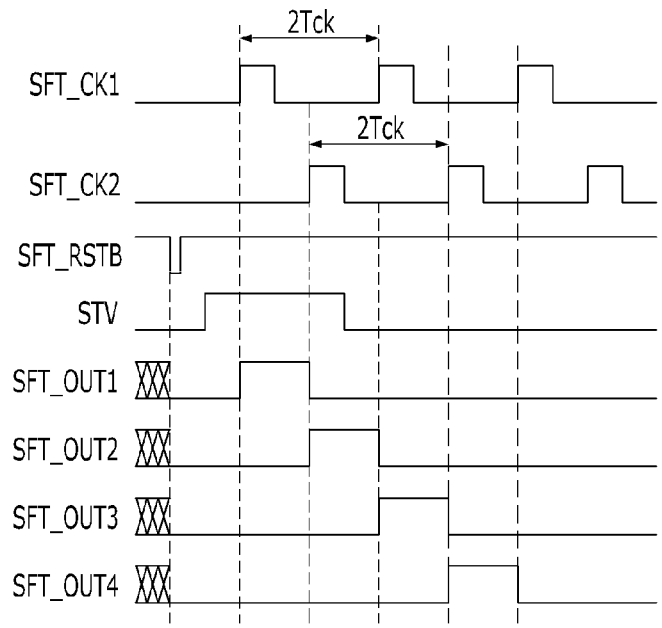
FIG. 9 is a waveform diagram illustrating the operation of the shift register circuit of FIG. 8.

The operation of the shift registers S/R1, S/R2, . . . will now be described with reference to a waveform diagram of FIG. 9.

First, in response to the first clock signal SFT_CK1 having two times the period of the shift register clock signal SFT_CK being applied, the clock controller AG1 may receive the first clock signal SFT_CK1 and the horizontal start signal STV, and may generate the gate signal G to the dynamic latch DL1 of the shift register S/R1. The dynamic latch DL1 may generate the output signal SFT_OUT1 of a high level in response to the gate signal G provided from the clock controller AG1 being at a high level.

Next, the output signals of the clock controllers AG2, AG4, . . . receiving the output signals SFT_OUT1, SFT_OUT3, . . . of the odd latches DL1, DL3, . . . and the second clock signal SFT_CK2 as input signals may be provided as the gate signals G of the even dynamic latches DL2, DL4, . . . . The output signals SFT_OUT2, SFT_OUT4, . . . of the even dynamic latches DL2, DL4, . . . may be generated. The output signals of the clock controllers AG3, . . . receiving the output signals SFT_OUT2, SFT_OUT4, . . . of the even dynamic latches DL2, DL4, . . . and the first clock signal SFT_CK1 as input signals may be applied as the gate signals G of the odd dynamic latches DL3, . . . . The output signals SFT_OUT3, . . . of the odd dynamic latches DL3, . . . may be generated.

Figure 10:
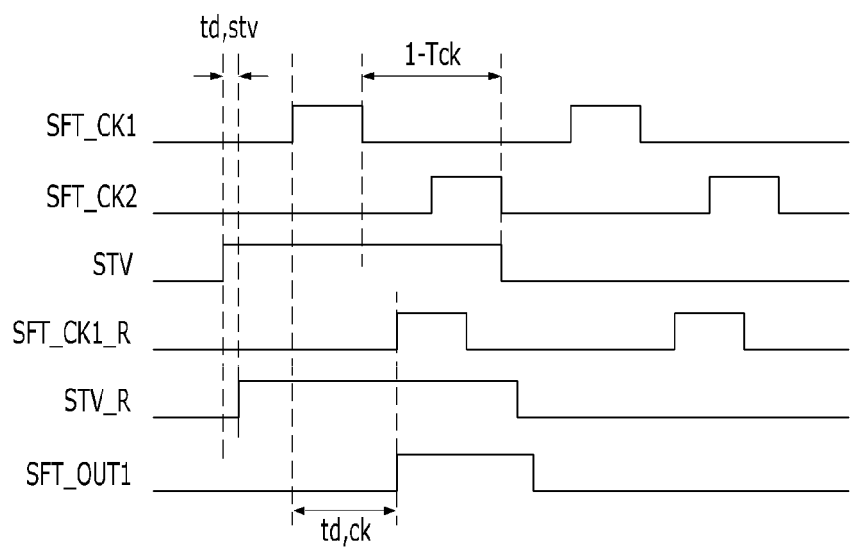
FIG. 10 is a waveform diagram explaining a holding margin of the shift register circuit of FIG. 8.

The improved shift register circuit 100a may generate the output signals SFT_OUT1, SFT_OUT2, . . . , according to the first and second clock signals SFT_CK1 and SFT_CK2 having two times the period of the shift register clock signal SFT. Thus, as illustrated in a timing diagram of FIG. 10, even though the horizontal start signal STV is delayed by a delay time "td,stv" and the first clock signal SFT_CK1 is delayed by a delay time "td,ck", the holding margin with respect to the horizontal start signal STV may be further ensured by (1-Tck). Therefore, malfunction may be prevented even when the period Tck of the shift register clock signal SFT is short or the delay time "td,ck" is long.

Meanwhile, the respective shift registers S/R1, S/R2, . . . may be configured to be reset by the output controllers NR1, NR2, . . . after the output signals SFT_OUT2, SFT_OUT3, . . . of the next shift registers S/R2, S/R3, . . . are generated. The output controllers NR1, NR2, . . . may rest the dynamic latches DL1, DL2, . . . by applying the reset signals to their reset terminals in response to the output signals SFT_OUT1, SFT_OUT2, . . . of the next shifter registers S/R1, S/R2, . . . changing to a high level or the shift register reset signal SFT_RST changing to a high level.

Figure 5:
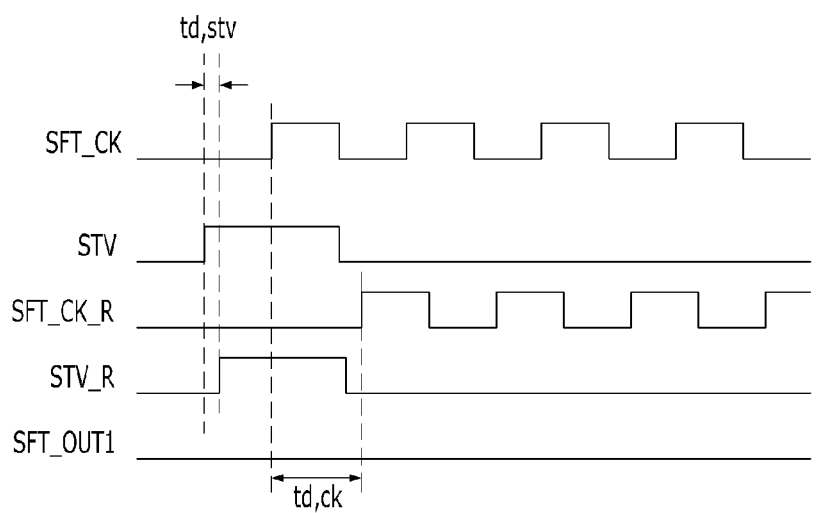
FIG. 5 is a waveform diagram illustrating the malfunction of the shift register circuit of FIG. 3.

That is, as illustrated in FIG. 5, the malfunction occurs in the conventional shift register circuit 100 in response to the output of the previous shift register becoming a low level before a high level pulse is latched in the next shift register. However, the improved shift register circuit 100a may prevent the malfunction because the output signals of the previous shift registers S/R1, S/R2, . . . may be maintained by the output controllers NR1, NR2, . . . .

Figure 11:
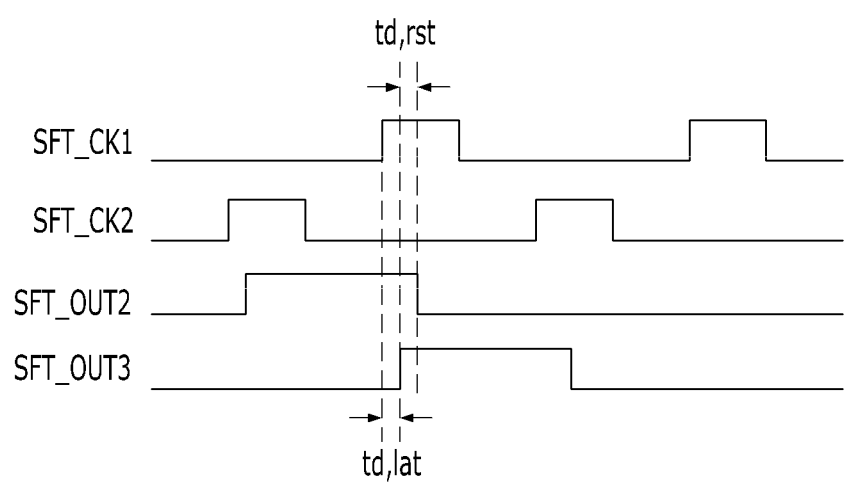
FIG. 11 is a waveform diagram explaining the operation of an output control unit in the shift register circuit of FIG. 8.

More specifically, referring to a waveform diagram of FIG. 11, presuming that a transfer delay of the dynamic latches DL1, DL2, . . . of the shift registers S/R1a, S/R2a, . . . is "td,lat" and a reset delay is "td,rst", the output signal SFT_OUT2 of the previous shift register S/R2a may change to a high level in response to the first clock signal SFT_CK1 being in a high level state, and then the output signals SFT_OUT3 of the next shift register S/R3a may change to a high level after the delay time "td,lat". In addition, the output signal SFT_OUT3 of the next shift register S/R3a may change to a high level, and then the output signal SFT_OUT2 of the previous shift register S/R2a may change to a low level after the delay time "td,rst".

Meanwhile, as the shift register clock SFT_CK may be continuously applied to the flip-flops which may not actually perform the shifting operation, the low level pulse may be continuously latched, thus causing unnecessary current consumption. However, in an embodiment, as the gate signals of the dynamic latches DL1, DL2, . . . may be provided by the clock controllers AG1, AG2, . . . , the gate signals may be provided to only the dynamic latches which may actually perform the shifting operation, thus preventing unnecessary current consumption.

That is, the first clock signal SFT_CK1 may be provided as the gate signals of the odd dynamic latches DL1, DL3, . . . only in response to the horizontal start signal STV or the output signals SFT_OUT2, SFT_OUT4, . . . of the previous dynamic latches DL2, DL4, . . . being at a high level. Hence, only one of the dynamic latches DL1, DL3, . . . may perform the shifting operation. Likewise, the second clock signal SFT_CK2 may be provided as the gate signals of the even dynamic latches DL2, DL4, . . . only in response to the output signals SFT_OUT1, SFT_OUT3, . . . of the previous dynamic latches DL1, DL3, . . . being at a high level. Hence, only one of the dynamic latches DL2, DL4, . . . may perform the shifting operation.

Furthermore, as the odd and even shift registers may perform the shifting operation by using the first and second clock signals SFT_CK1 and SFT_CK2 having two times the period of the shift register clock signal SFT_CK, an amount of current consumed by the shifting clock toggling may be reduced.

The source driver in accordance with the embodiment may also be applied to flat panel display panels, such as liquid crystal display (LCD) panels, plasma display panels (PDPs), organic light emitting display (OLED) panels.

The shift register circuit and the source driver including the same may reduce the current consumption and the circuit size because each shift register may be implemented with a single dynamic latch.

The odd shift registers and the even shift registers may be designed to shift input signals in response to two different clock signals having two times the period of the shift register clock signal. Therefore, the shifting operation may be exactly performed to generate the latch clock signal. Furthermore, as the shifting operation may be performed using the clock signals having two times the period of the shift register clock signal, the holding margin with respect to the horizontal start signal may be ensured and the current consumption may be reduced up to approximately 50%.

Moreover, as the output signal of the previous shift register may be maintained until the output signal of the next shift register is generated, it may be possible to solve the problem that the conventional shifting operation itself is not performed. As the gate signal may be applied to only the latch which performs the high pulse shifting operation, the clock signals may not be provided to the flip-flops which do not actually perform the shifting operation. Thus, it may be possible to prevent the occurrence of unnecessary current consumption.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A shift register circuit, comprising:
a plurality of shift registers configured to generate latch clock signals by sequentially shifting input signals according to a first clock signal and a second clock signal, the first clock signal and the second clock signal each comprising a period longer than a period of a shift register clock signal; and the first clock signal and the second clock signal having phases different from each other,
wherein odd shift registers among the plurality of shift registers are configured to be driven by the first clock signal;
even shift registers are configured to be driven by the second clock signal; and
at least one shift register among the plurality of shift registers comprises an output controller comprising a NOR gate configured to control an output signal of the at least one shift register by generating a reset signal of a dynamic latch based on an output signal of a next shift register and a shift register reset signal applied to the plurality of shift registers.

2. The shift register circuit of claim 1, wherein the phase of the second clock signal lags behind the phase of the first clock signal.

3. The shift register circuit of claim 1, wherein the first clock signal and the second clock signal each comprise two times the period of the shift register clock signal.

4. The shift register circuit of claim 3, wherein the phase of the second clock signal lags behind the phase of the first clock signal by the period of the shift register clock signal.

5. The shift register circuit of claim 1, wherein:
the odd shift registers are configured to perform the shifting operation at the rising edges of the first clock signal in response to a horizontal start signal or the output signal of the previous shift register, provided as an input signal, being at a high level; and
the even shift registers are configured to perform the shifting operation at the rising edges of the second clock signal in response to the output signal of the previous shift register being at a high level.

6. The shift register circuit of claim 1, wherein, in response to the plurality of shift registers completing the shifting operation, a level of the output signal of the previous shift register is configured to change after an output signal of a next shift register is generated.

7. The shift register circuit of claim 1, wherein the plurality of shift registers are configured to be controlled by an output signal of a next shift register, such that only one shift register performs a shifting operation.

8. The shift register circuit of claim 1, wherein each of the shift registers comprises a clock controller configured to control the first and second clock signals; and
each of the shift registers is configured to shift the input signal in response to a gate signal provided from the clock controller.

9. The shift register circuit of claim 8, wherein the clock controller comprises an AND gate configured to:
receive the horizontal start signal or the output signal of the previous shift register as one input signal;
receive the first clock signal or the second clock signal as another input signal; and
generate the gate signal.

10. The shift register circuit of claim 9, wherein the dynamic latch is configured to be:
supplied with a power supply voltage through an input terminal; and
supplied with the output signal of the clock controller as the gate signal.

11. The shift register circuit of claim 1, wherein the first clock signal and the second clock signal each have its rising edges corresponding to a rising edge of the shift register clock signal.

12. A source driver for use in a flat panel display device, comprising:
a data register circuit configured to latch external data to be displayed on the flat panel display device, according to latch clock signals; and
a shift register circuit comprising a plurality of shift registers, the shift register circuit configured to:
shift input signals, according to first and second clock signals comprising different phases, the first clock signal and the second clock signal each comprising a period longer than a period of a shift register clock signal; and
provide the latch clock signals to the data register circuit, wherein
at least one shift register among the plurality of shift registers comprises an output controller comprising a NOR gate configured to control an output signal of the at least one shift register by generating a reset signal of a dynamic latch based on an output signal of a next shift register and a shift register reset signal applied to the plurality of shift registers.

13. The source driver of claim 12, wherein the first clock signal and the second clock signal each comprise two times the period of the shift register clock signal.

14. The source driver of claim 12, wherein the phase of the second clock signal lags behind the phase of the first clock signal by the period of the shift register clock signal.

15. The source driver of claim 12, wherein:
the shift register circuit comprises a plurality of shift registers configured to generate the latch clock signals by sequentially shifting the input signals, according to the first and second clock signals;
the first clock signal is provided to the odd shift registers among the plurality of shift registers; and
the second clock signal comprising the phase lagging behind the phase of the first clock signal by the period of the shift register clock signal is provided to the even shift registers among the plurality of shift registers.

16. The source driver of claim 15, wherein, in response to the plurality of shift registers completing the shifting operation, a level of the output signal of the previous shift register is configured to change after an output signal of a next shift register is generated.

17. The source driver of claim 15, wherein the shift register is configured to be controlled by an output signal of a next shift register, such that the shift register shifts the input signal in response to the first or second clock signal during only a high level duration of the input signal.

18. The source driver of claim 15, wherein each of the shift registers comprises a clock controller configured to control the first and second clock signals; and each of the shift registers is configured to:
receive an output signal of the clock controller as a gate signal; and
shift the input signal.

19. The source driver of claim 18, wherein the clock controller comprises an AND gate configured to:
receive a horizontal start signal or the output signal of the previous shift register as one input signal;
receive the first clock signal or the second clock signal as another input signal; and
generate the gate signal.

20. The source driver of claim 19, wherein the dynamic latch is configured to be:
supplied with a power supply voltage through an input terminal; and
supplied with the output signal of the AND gate as the gate signal.

21. The source driver of claim 12, further comprising a latch clock generator configured to:
receive the output signal of the dynamic latch and the first or second clock signal; and
generate the latch clock signal.

22. The shift register circuit of claim 12, wherein the first clock signal and the second clock signal each have its rising edges corresponding to a rising edge of the shift register clock signal.

23. A method for a shift register circuit, comprising:
generating latch clock signals with a plurality of shift registers by sequentially shifting input signals according to a first clock signal and a second clock signal, the first clock signal and the second clock signal each comprising a period longer than a period of a shift register clock signal; and the first clock signal and the second clock signal having phases different from each other,
wherein odd shift registers among the plurality of shift registers are driven by the first clock signal;
even shift registers are driven by the second clock signal; and
at least one shift register among the plurality of shift register comprises an output controller comprising a NOR gate is used to control an output signal of the at least one shift register by generating a reset signal of a dynamic latch based on an output signal of a next shift register and a shift register reset signal applied to the plurality of shift registers.

24. The method of claim 23, wherein the phase of the second clock signal lags behind the phase of the first clock signal.

25. The method of claim 23, wherein the first clock signal and the second clock signal each comprise two times the period of the shift register clock signal.

26. The method of claim 25, wherein the phase of the second clock signal lags behind the phase of the first clock signal by the period of the shift register clock signal.

27. The method of claim 23, wherein:
the odd shift registers perform the shifting operation at the rising edges of the first clock signal in response to a horizontal start signal or the output signal of the previous shift register, provided as an input signal, being at a high level; and
the even shift registers perform the shifting operation at the rising edges of the second clock signal in response to the output signal of the previous shift register being at a high level.

28. The shift register circuit of claim 23, wherein the first clock signal and the second clock signal each have its rising edges corresponding to a rising edge of the shift register clock signal.

* * * * *